United States Patent
Su et al.

(10) Patent No.: US 11,825,606 B2
(45) Date of Patent: Nov. 21, 2023

(54) SMT PROCESS PREDICTION TOOL FOR INTELLIGENT DECISION MAKING ON PCB QUALITY

(71) Applicants: Southwest Electronic Technology Research Institute (The Tenth Research Institute of China Electronics Technology Group Corporation), Sichuan (CN); Chunquan Li, Guangxi Zhuang Autonomous Region (CN)

(72) Inventors: Xin Su, Sichuan (CN); Dejin Yan, Sichuan (CN); Fuyao Lai, Sichuan (CN); Guangheng Luo, Sichuan (CN)

(73) Assignee: Chengdu Aeronautic Polytechnic, Chengdu (CN)

( * ) Notice: Subject to any disclaimer, the term of this patent is extended or adjusted under 35 U.S.C. 154(b) by 227 days.

(21) Appl. No.: 17/405,629

(22) Filed: Aug. 18, 2021

(65) Prior Publication Data

US 2022/0104410 A1 Mar. 31, 2022

(30) Foreign Application Priority Data

Sep. 28, 2020 (CN) .......................... 202011043006.9

(51) Int. Cl.
*B23K 31/00* (2006.01)
*H05K 13/04* (2006.01)
(Continued)

(52) U.S. Cl.
CPC ....... *H05K 13/0465* (2013.01); *B23K 31/125* (2013.01); *G06N 3/08* (2013.01); *H05K 3/1216* (2013.01); *H05K 3/3463* (2013.01)

(58) Field of Classification Search
CPC ............ H05K 13/0465; H05K 3/1216; H05K 3/3463; H05K 3/341; H05K 13/08;
(Continued)

(56) References Cited

U.S. PATENT DOCUMENTS

2002/0069395 A1* 6/2002 Fujiwara .............. H05K 13/083
716/112
2019/0333792 A1* 10/2019 Ikeda ..................... B23K 1/008
(Continued)

FOREIGN PATENT DOCUMENTS

CN 1366449 A * 8/2002
CN 104668695 A * 6/2015 ............... B23K 3/00
(Continued)

*Primary Examiner* — Kiley S Stoner
(74) *Attorney, Agent, or Firm* — Meunier Carlin & Curfman LLC

(57) ABSTRACT

A surface mounted technology (SMT) process prediction tool for intelligent decision making on PCB quality is disclosed. A data fusion tool automatically reads size parameters and component information on design conditions of a printed board to be assembled from a database and creates a design condition list for different components for a software execution layer; a printing parameter decision-making toolkit and a soldering parameter decision-making toolkit in the software execution layer perform comparisons on printing and soldering data according to design conditions of components on the printed board to be assembled, perform automatic decision making on printing and soldering parameters with a multi-objective optimization algorithm and a deep learning algorithm, predict printing quality and soldering quality, and send decided printing and soldering process parameters and corresponding predicted quality results to a human-computer interaction toolkit, to visually display the printing and soldering process parameters and the predicted quality values.

3 Claims, 1 Drawing Sheet

(51) Int. Cl.
*G06N 3/08* (2023.01)
*H05K 3/12* (2006.01)
*H05K 3/34* (2006.01)
*B23K 31/12* (2006.01)

(58) Field of Classification Search
CPC ...... H05K 13/083; H05K 13/086; G06N 3/08; Y02P 70/50; G06F 30/27; G06F 30/31; G06F 2115/12; B23K 1/19; B23K 31/12–125
USPC ........................................ 228/102–105, 8–12
See application file for complete search history.

(56) References Cited

U.S. PATENT DOCUMENTS

| | | | | |
|---|---|---|---|---|
| 2019/0364668 | A1* | 11/2019 | Nguyen | B23K 3/026 |
| 2020/0082278 | A1* | 3/2020 | Wu | G06N 20/00 |
| 2022/0292661 | A1* | 9/2022 | Ng | G06T 7/10 |
| 2022/0398714 | A1* | 12/2022 | Sun | H05K 13/083 |

FOREIGN PATENT DOCUMENTS

| | | | | | |
|---|---|---|---|---|---|
| CN | 104684270 | A | * | 6/2015 | ............. G08B 21/00 |
| CN | 104777166 | A | * | 7/2015 | ............ G01N 21/956 |
| CN | 106561078 | A | * | 4/2017 | ............ H05K 13/021 |
| CN | 107896428 | A | * | 4/2018 | |
| CN | 110248495 | A | * | 9/2019 | |
| CN | 110704974 | A | * | 1/2020 | |
| CN | 112261866 | A | * | 1/2021 | |
| CN | 113094980 | A | * | 7/2021 | |
| CN | 113438824 | A | * | 9/2021 | |
| CN | 113709995 | A | * | 11/2021 | |
| DE | 102013114060 | A1 | * | 7/2015 | ........... B23K 1/0056 |
| DE | 102015217181 | A1 | * | 3/2017 | |
| DE | 102015217182 | A1 | * | 3/2017 | ......... H05K 13/0465 |
| EP | 1239719 | A2 | * | 9/2002 | |
| EP | 3480585 | A1 | * | 5/2019 | |
| EP | 3530463 | A1 | * | 8/2019 | |
| KR | 20170116447 | A | * | 10/2017 | |
| KR | 20190102974 | A | * | 9/2019 | |
| KR | 20210018101 | A | * | 2/2021 | |
| WO | WO-2017003372 | A1 | * | 1/2017 | |

* cited by examiner

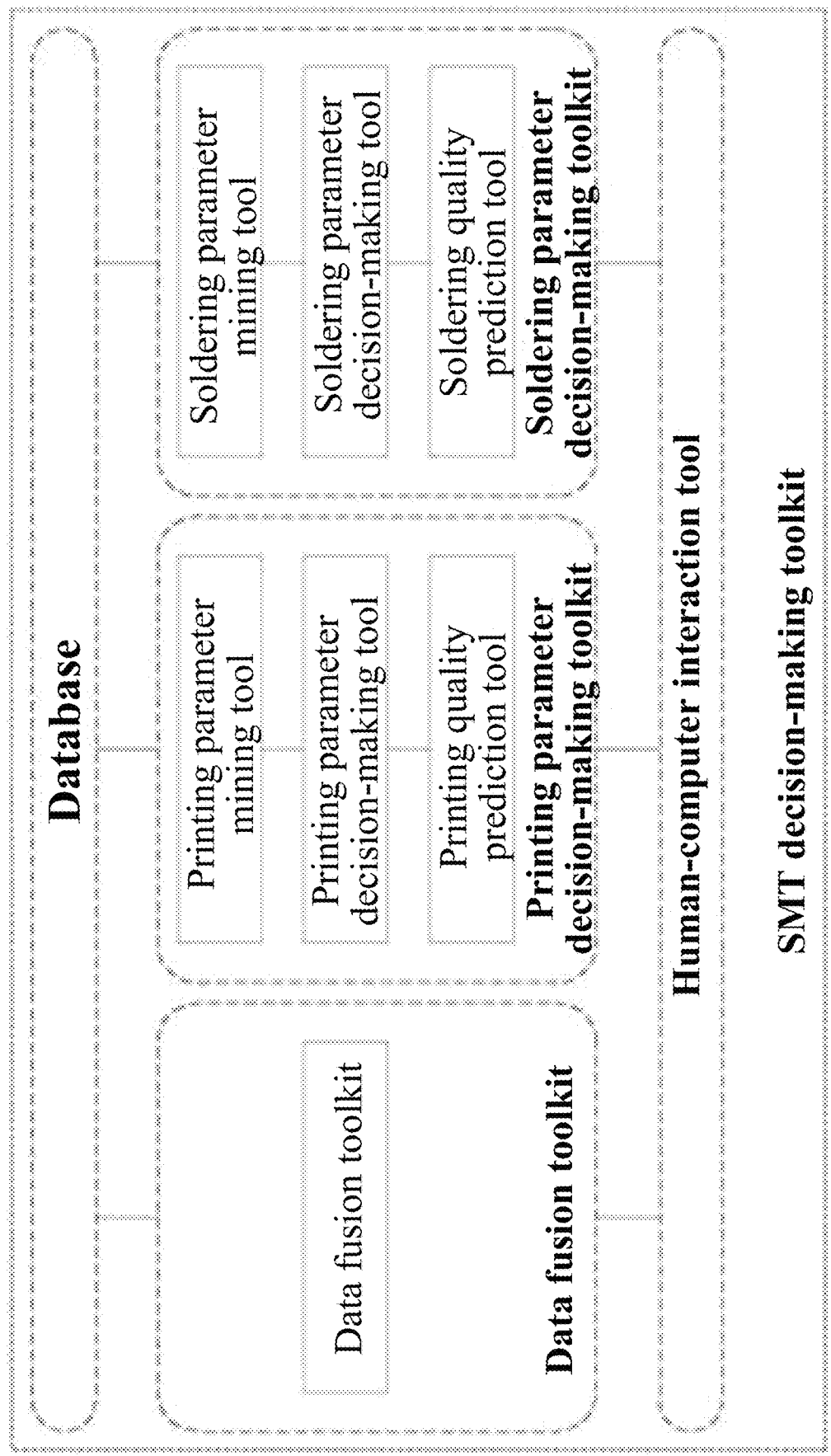

SMT PROCESS PREDICTION TOOL FOR INTELLIGENT DECISION MAKING ON PCB QUALITY

CROSS REFERENCE TO RELATED APPLICATION

This patent application claims the benefit and priority of Chinese Patent Application No. 202011043006.9, entitled "SMT PROCESS PREDICTION TOOL FOR INTELLIGENT DECISION MAKING ON PCB QUALITY" filed with the China National Intellectual Property Administration on Sep. 28, 2020, the disclosure of which is incorporated by reference herein in its entirety as part of the present application.

TECHNICAL FIELD

The present disclosure relates to a surface mounted technology (SMT) process prediction tool for intelligent decision making on printed circuit board (PCB) quality using intelligent technology, specifically including automatic decision making and quality prediction on key printing and soldering processes of an SMT production line.

BACKGROUND ART

SMT is the most popular technology in electronic assembly industry at present. In particular, SMT is a circuit assembly and connection technology by which lead-free or short-lead surface mounted components/surface mounted devices (SMCs/SMDs, also known as chip components) are installed on a surface of a PCB or other substrate and then soldered and assembled by reflow soldering, dip soldering, or the like. The use of SMT can result in: 1) 40% to 60% reduction in size and 60% to 80% reduction in weight of electronic products; 2) high reliability, high anti-vibration ability and low solder joint defect rate; 3) excellent high-frequency characteristics and reduced electromagnetic and radio-frequency interference; 4) ease of automation, and improved production efficiency; 5) 30% to 50% decrease in cost; and 6) saving of materials, energy, equipment, manpower, time, etc. Currently, it is desired that electronic products become miniaturized and lightweight, which can be hardly achieved by a through hole technology (THT) assembly. In addition, a function integration of an electronic product, such that integrated circuit (IC) components are largely and fully used to meet requirements of large scale and high integrity, can be achieved by SMT assembly.

SMT assembly typically includes solder paste printing, solder paste inspection (SPI), die placement, reflow soldering, automated optical inspection (AOI), X-ray inspection, and reworking, as well as visual inspection after each step. Solder paste printing is a process of printing pads on a PCB with solder paste, so that various SMCs or SMDs can be bonded to the PCB by means of the solder paste on the pads. A metal stencil plate is used in solder paste printing, and has many openings allowing the solder paste to be remained on the pads after printing. Die placement is a process of rapidly placing SMCs or SMDs on an SMT module. The SMCs or SMDs will be temporarily pasted on the surface of the PCB due to the adhesion of the solder paste. Components are permanently fixed on the PCB by reflow soldering conducted in a reflow soldering furnace having a temperature region in SMT assembly. During reflow soldering, the solder paste is melted at a high temperature in the first and second stages. Then the solder paste will be solidified as the temperature decreases, and hence the components will be fixed on the corresponding pads of the PCB.

Product quality is the lifeline of an enterprise. SMT is a complex comprehensive systematic engineering technology with complicated processes. It is necessary to take control over many aspects such as PCB design, components, materials, processes, equipment, rules and regulations to ensure the quality of SMT processing. Increasing products without quality assurance will only cause waste and loss. Any repair work may add unstable factors to the quality of the finished products. With a gradual application of big data, intelligent manufacturing and other technologies, the production processes of SMT production lines are becoming more intelligent, such that real-time analysis and basic statistical analysis of production line data have been realized, and immediate production states and production parameters can be shown in histograms, pie charts, etc. on large screens in work sites of SMT production lines. However, automatic recommendation on production process parameters and real-time quality prediction of SMT production lines cannot be achieved. SMT production lines are typical electronic manufacturing production lines. As a basis of an electronic product manufacturing industry, the PCB assembly (hereinafter referred to as PCBA) and the production of electronic products (e.g., terminal products such as mobile phones, and computers) on the market are inseparable from the SMT production lines. An SMT production line has many process steps and the process design is affected by multiple factors. Process parameters are related not only to materials such as solder paste, printed board materials, and components, but also to process systems such as equipment and soldering pressure, and further related to the experience of technicians. Due to the many variables in the production line, such as from equipment, personnel and materials, which influence one another to varying degrees every day, it is difficult to take effective and adequate monitoring without affecting production and increasing production costs. Due to numerous influencing factors, the process design mainly relies on the experience of technicians combined with process tests, and preliminary analysis and post control of quality is conducted by using the traditional statistical process control (SPC) technology and personal experience, which leads to the limited improvement of product quality.

SUMMARY

In view of the defects in the conventional art, the present disclosure intends to provide an SMT intelligent decision-making toolkit which is highly automated, pushes accurate process parameters, and renders processes controllable with low defect rate and low cost.

To achieve the above effect, the present disclosure provides an SMT process prediction tool for intelligent decision making on PCB quality, including software layers of an SMT intelligent decision-making toolkit which includes a data fusion toolkit, a printing parameter decision-making toolkit, a soldering parameter decision-making toolkit and a human-computer interaction toolkit all in communication with a database, wherein a data fusion tool automatically reads size parameters and component information on design conditions of a printed board to be assembled from the database and creates a design condition list for different components for a software execution layer; the printing parameter decision-making toolkit and the soldering parameter decision-making toolkit in the software execution layer perform comparisons with historical printing and soldering data of components under conditions of different printed boards according to design conditions of components on the printed board to be assembled, mine one or more groups of data of alternative satisfactory printing parameter combinations and soldering parameter combinations for components respectively, perform automatic decision making on printing and soldering parameters with a multi-objective optimization algorithm and a deep learning algorithm, predict printing quality and soldering quality according to size parameters and component information in a printed board design document, and send decided printing and soldering process parameters and corresponding predicted quality results to a human-computer interaction toolkit, to visually display the printing and soldering process parameters and predicted quality values.

Compared with the conventional art, the technical effects of the present disclosure are as follows:

High degree of automation is realized. According to the present disclosure, the software layers of the SMT intelligent decision-making toolkit is constituted of the data fusion toolkit, the printing parameter decision-making toolkit, the soldering parameter decision-making toolkit and the human-computer interaction toolkit all in communication with the database. The design conditions of the printed board to be assembled can be automatically read by automatic data collection with the data fusion toolkit. The printing parameter decision-making toolkit and the soldering parameter decision-making toolkit perform automatic decision making and recommendation on printing and soldering process parameters of an SMT production line cooperatively. Thus, full automatic advance prediction on quality in the printing and soldering processes of the SMT production line is realized, and the intelligent level of the SMT production line is promoted.

Accurate process parameters are pushed. According to the present disclosure, the data fusion tool automatically reads size parameters and component information on design conditions of a printed board to be assembled from the database and creates a design condition list for different components for a software execution layer. The printing parameter decision-making toolkit and the soldering parameter decision-making toolkit in the software execution layer perform comparisons with historical printing and soldering data of components under conditions of different printed boards according to design conditions of components on the printed board to be assembled, mine one or more groups of alternative satisfactory printing parameter combinations and soldering parameter combinations for components respectively, perform automatic decision making on printing and soldering parameters with a multi-objective optimization algorithm and a deep learning algorithm, and predict printing quality and soldering quality according to size parameters and component information in a printed board design document. As a result, adaptive pushing of process parameters and automatic prediction on printing quality and soldering quality during printing and soldering are realized with high accuracy rate. Accurate, reliable and reasonable process parameters may be provided. Besides, satisfactory printing and soldering process parameters can be automatically recommended by analyzing outline dimensions and components of different printed boards.

The processes can be controlled with low defect rate and low cost. According to the present disclosure, automatic decision making is performed on printing and soldering process parameters with corresponding qualities by the data fusion toolkit, the printing parameter decision-making toolkit and the soldering parameter decision-making toolkit based on the production data of SMT production processes of the SMT production line according to predicted size parameters and component information in an optimal printed board design document, and the corresponding predicted quality results are then sent to the human-computer interaction toolkit to visually show the printing and soldering process parameters and predicted quality values to a technologist for reference and confirmation in PCB control, which reduces uncertainties caused by human factors, avoids quality accidents of batches of PCBs, significantly reduces the defect rate and the manufacturing cost, and thus improves the production efficiency as a whole.

BRIEF DESCRIPTION OF THE DRAWINGS

FIG. 1 is a constitution diagram of an SMT intelligent decision-making toolkit according to an embodiment of the present disclosure.

The present disclosure will be further described below with reference to the accompanying drawings and embodiments, but is not thereby limited to the scope of the described embodiments.

DETAILED DESCRIPTION OF THE EMBODIMENTS

Reference is made to FIG. 1. In a preferred embodiment described below, an SMT process prediction tool for intelligent decision making on PCB quality includes software layers of an SMT intelligent decision-making toolkit constituted of a data fusion toolkit, a printing parameter decision-making toolkit, a soldering parameter decision-making toolkit and a human-computer interaction toolkit all in communication with a database, where a data fusion tool automatically reads size parameters and component information on design conditions of a printed board to be assembled from the database and creates a design condition list for different components for a software execution layer; the printing parameter decision-making toolkit and the soldering parameter decision-making toolkit in the software execution layer perform comparisons with historical printing and soldering data of components under conditions of different printed boards according to design conditions of components on the printed board to be assembled, mine one or more groups of data of alternative satisfactory printing parameter combinations and soldering parameter combinations for components respectively, perform automatic decision making on printing and soldering parameters with a multi-objective optimization algorithm and a deep learning algorithm, predict printing quality and soldering quality according to size parameters and component information in a printed board design document, and send decided printing and soldering process parameters and corresponding predicted quality results to the human-computer interaction toolkit, to visually display the printing and soldering process parameters and predicted quality values to a technologist for reference and confirmation.

The database includes design conditions, printing process parameters and corresponding solder paste inspection (SPI) results, and soldering process parameters and corresponding automated optical inspection (AOI) results of printed boards processed on SMT production line.

In this embodiment, specific steps are as follows:

S1, when a printed board needs to be assembled, the data fusion toolkit automatically reads the size parameters and component information in the printed board design document, creates the design condition list (including printed board thickness, printed board material, and component positions) for different components, and provides the design condition list to the printing parameter decision-making toolkit, the soldering parameter decision-making toolkit and the human-computer interaction tool for use.

S2, when the printed board needs to be printed, the printing parameter decision-making toolkit performs automatic decision making on printing parameters according to the design conditions of the printed board to be assembled, predicts corresponding printing quality, and provides via the human-computer interaction tool the result to the technologist for interactive query and confirmation.

S3, when the printed board needs to be soldered, the soldering parameter decision-making toolkit performs automatic decision making on soldering parameters according to the design conditions of the printed board to be assembled, predicts corresponding soldering quality, and provides via the human-computer interaction tool the result to the technologist for interactive query and confirmation.

S4, after the printed board is assembled, the printing and soldering results of the printed board, together with the design conditions, the printing process parameters and the soldering process parameters of the printed board, are stored by the technologist in the database as historical data in future printed board assembling.

The foregoing are descriptions of the preferred embodiment of the present disclosure. It should be noted that the above embodiment is illustrative of the present disclosure, but is not limited to the present disclosure. Moreover, alternative embodiments can be designed by a person skilled in the art without departing from the scope of the appended claims. Various variations and improvements can be made by a person of ordinary skill in the art without departing from the principle and essence of the present disclosure, and these variations and improvements should also be considered as falling within the protection scope of the present invention.

What is claimed is:

1. A surface mounted technology (SMT) process prediction tool for decision making on printed circuit board (PCB) quality, comprising:
    software layers of an SMT decision-making toolkit which comprises:
        a data fusion toolkit;
        a printing parameter decision-making toolkit;
        a soldering parameter decision-making toolkit; and
        a human-computer interaction toolkit all in communication with a database,
    wherein a data fusion tool automatically reads size parameters and component information on design conditions of a printed board to be assembled from the database and creates a design condition list for different components for a software execution layer;
    wherein the printing parameter decision-making toolkit and the soldering parameter decision-making toolkit in the software execution layer perform comparisons with prestored printing and soldering data of components under conditions of different printed boards according to design conditions of components on the printed board to be assembled,
    wherein data mining is performed to obtain one or more groups of data of alternative satisfactory printing parameter combinations and soldering parameter combinations for components respectively,
    wherein automatic decision making is performed on printing and soldering parameters with a multi-objective optimization algorithm and a deep learning algorithm,
    wherein printing quality and soldering quality is predicted according to size parameters and component information in a printed board design document, and
    wherein the printing and soldering process parameters obtained by automatic decision making and corresponding predicted quality results are sent to the human-computer interaction toolkit to visually display the printing and soldering process parameters and predicted quality values.

2. The SMT process prediction tool for decision making on PCB quality according to claim 1, wherein the condition list comprises data of printed board thickness, printed board material and component positions.

3. The SMT process prediction tool for decision making on PCB quality according to claim 1, wherein the database comprises design conditions, printing process parameters and corresponding solder paste inspection (SPI) results, and soldering process parameters and corresponding automated optical inspection (AOI) results of printed boards processed on SMT production line.

* * * * *